United States Patent [19]

Ishikawa et al.

[11] Patent Number: 4,837,106
[45] Date of Patent: Jun. 6, 1989

[54] RECORDING MATERIALS CONTAINING PHOTOPOLYMERIZABLE COMPOSITION AND COMPONENT CAPABLE OF CAUSING A COLOR REACTION IN MICROCAPSULES

[75] Inventors: Shun-ichi Ishikawa; Tadao Imagawa; Minoru Maeda; Fumiaki Shinozaki, all of Shizuoka, Japan

[73] Assignee: Fuji Photo Film Co., Ltd., Kanagawa, Japan

[21] Appl. No.: 946,625

[22] Filed: Dec. 29, 1986

Related U.S. Application Data

[63] Continuation of Ser. No. 744,176, Jun. 13, 1986, abandoned.

[30] Foreign Application Priority Data

Jun. 13, 1984 [JP] Japan ................ 59-121638

[51] Int. Cl.$^4$ .................. G03C 1/40; G03C 1/00; G03C 1/68
[52] U.S. Cl. .................... 430/138; 430/281; 430/920; 430/922; 430/926
[58] Field of Search ............... 430/281, 296, 922, 920, 430/138; 204/159.22, 159.23

[56] References Cited

U.S. PATENT DOCUMENTS

| | | | |
|---|---|---|---|
| 3,418,118 | 12/1968 | Thommes et al. | 430/281 |
| 3,549,367 | 12/1970 | Chang et al. | 430/306 X |
| 3,652,275 | 3/1972 | Baum et al. | 430/281 X |
| 4,410,621 | 10/1983 | Wada et al. | 430/920 X |
| 4,413,843 | 9/1983 | Iwasaki et al. | 106/308 N |
| 4,529,681 | 7/1985 | Usami et al. | 430/281 X |
| 4,562,137 | 12/1985 | Sanders | 430/138 |

Primary Examiner—Mukund J. Shah
Attorney, Agent, or Firm—Sughrue, Mion, Zinn, Macpeak & Seas

[57] ABSTRACT

A recording material comprising (i) an addition polymerizable compound having at least one ethylenic unsaturated double bond, (ii) a photopolymerization initiator composition and (iii) at least one component capable of causing a color reaction, wherein components (i), (ii) and (iii) are contained in microcapsules; and wherein said photopolymerization initiator composition (ii) comprises the following components (a), (b) and (c), whereby the light sensitivity of the recording material is improved:

(a) a photo-absorbent having a molecular extinction coefficient of $10^3$ or more at a maximum absorption wavelength;
(b) a hexaaryl-biimidazole; and
(c) a heterocyclic mercapto compound of general formula (I):

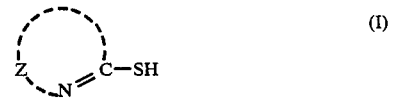

where Z is a non-metallic atomic group for formation of a nitrogen-containing heterocyclic nucleus.

8 Claims, No Drawings

RECORDING MATERIALS CONTAINING PHOTOPOLYMERIZABLE COMPOSITION AND COMPONENT CAPABLE OF CAUSING A COLOR REACTION IN MICROCAPSULES

This is a continuation of application Ser. No. 744,176, filed June 13, 1986, now abandoned.

FIELD OF THE INVENTION

The present invention relates to a recording material and, in particular, to that containing a photopolymerization composition and a component capable of causing a color reaction in microcapsules, wherein the photopolymerization components in said composition are polymerized by exposure and said component for color reaction may thus be enclosed in microcapsules.

BACKGROUND OF THE INVENTION

A pressure-sensitive recording material utilizing a color reaction of microcapsules is known. It is also known to further incorporate a photopolymerization composition in said microcapsules thereby to terminate the color reaction of the recording material. For example, Japanese patent application (OPI) No. 89915/77 (the term "OPI" as used herein refers to a "published unexamined Japanese patent application") discloses a light-sensitive and heat-sensitive recording material which is to be heated after exposure; and Japanese patent application (OPI) Nos. B 124343/82, 179836/82 and 197538/82 disclose a light-sensitive and pressure-sensitive recording material which is to be recorded by means of a combination of an exposure step and a pressure step. In these techniques, microcapsules containing a photopolymerization composition are entirely hardened due to exposure, which results in the occurrence of a difference in hardness between the thus hardened microcapsules and the other non-hardened microcapsules in the non-exposed part, which phenomenon is utilized as the recording element. More precisely, these techniques utilize such a phenomenon that the microcapsules are hardened and the color forming component does not move (diffuse) even under heat, or otherwise, the microcapsules are hardened and cannot be crushed under normal pressure. The photopolymerization composition to be contained in the microcapsules comprises a photopolymerizable compound and a photopolymerization initiator, and aromatic ketones and quinone compounds are used as the photopolymerization initiator. In particular, benzoin-alkylethers are exemplified.

Various kinds of photopolymerization compositions have heretofore been developed for various purposes and uses including printing inks, plates to be printed, resists for base plates to be printed, etc., and these conventional compositions may be utilized in a photographic material for a recording material. For example, Japanese patent publication No. 37377/70 (corresponding to U.S. Pat. No. 3,418,118) discloses the use of photopolymerization initiator composition comprising 2,4,5-triphenyl-imidazolyl dimer and a free radical former; and Japanese patent publication No. 38403/73 (corresponding to U.S. Pat. No. 3,549,367) discloses the use of a photopolymerization initiator composition comprising 2,4,5-triphenyl-imidazolyl dimer and p-aminophenylketone. These publications mention that the photopolymerization compositions containing said photopolymerization initiator system are highly sensitive.

Conventional photopolymerization compositions which have heretofore been developed contain, in general, a binder, and most of said compositions may form a relief image by development. However, in the case that the composition containing no binder is kept liquid until hardened but does not form any relief image after being hardened, as the recording material of the present invention, it has been noticed that those compositions which have heretofore been known to be highly sensitive are not always highly sensitive.

Accordingly, conventional recording materials which have heretofore been used have a light-sensitizing speed of some degree and are effective only in limited uses. Thus, it has been required to obtain some other recording materials having a higher sensitivity, which may be applied to broader uses and may be used in a more compact and small sized exposure apparatus.

SUMMARY OF THE INVENTION

The subject matter of the present invention is, therefore, to solve the above mentioned problems in the known techniques, and to provide a novel recording material comprising a photopolymerization composition and a color forming component, enclosed in microcapsules, which has higher light sensitivity.

Accordingly, the present invention provides a recording material comprising (i) an addition polymerizable compound having at least one ethylenic unsaturated double bond, (ii) a photopolymerization initiator composition and (iii) at least one component capable of causing a color reaction, wherein components (i), (ii) and (iii) are contained in microcapsules; and wherein said photopolymerization initiator composition (ii) comprises the following components (a), (b) and (c):

(a) a photo-absorbent having a molecular extinction coefficient of $10^3$ or more at a maximum absorption wavelength;
(b) a hexaaryl-biimidazole; and
(c) a heterocyclic mercapto compound of general formula (I):

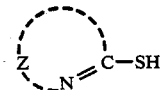

(I)

where Z is a non-metallic atomic group for formation of a nitrogen-containing heterocyclic nucleus.

DETAILED DESCRIPTION OF THE INVENTION

Addition polymerizable compounds having at least one ethylenic unsaturated double bond, which are the first essential component of the recording materials of the present invention, include those having, for example, an acryloyl group, a methacryloyl group, a vinyl group, an allyl group, an unsaturated polyester group, a vinyloxy group, an acrylamido group, a maleic acid residue, etc. The most typical examples of said compounds are reaction products of a polyol, polyamine or aminoalcohol and an unsaturated carboxylic acid and reaction products of a hydroxyl-containing acrylate or methacrylate and a polyisocyanate.

Representative examples of said compounds are as follows: polyethylene glycol diacrylate, propylene glycol dimethacrylate, pentaerythritol triacrylate, trimethylolpropane diacrylate, trimethylolpropane triacrylate, pentaerythritol tetraacylate, hexanediol diacrylate, 1,2-butanediol diacrylate, tetrakis-β-acryloxyethylethylenediamine, reaction products of epoxy resin and acrylic acid, reaction products of methacrylic acid, pentaerythritol and acrylic acid, condensation products of maleic acid, diethylene glycol and acrylic acid, methyl methacrylate, butyl methacrylate, styrene, divinylbenzene, diallylnaphthalene, etc. These may be used in the form of a mixture of two or more compounds, in accordance with the object and the use thereof.

The photopolymerization initiator composition of the present invention comprises a combination of three kinds of components, and the first component (a) is a photo-absorbent having a molecular extinction coefficient of $10^3$ or more at a maximum absorption wavelength. The wavelength range of the maximum absorption of said photo-abosrbent is not specifically limitative, and may fall within any of ultraviolet, visible ray and infrared ranges. In particular, photo-absorbents having a maximum absorption within a wavelength range of about 300 to 600 nm are preferred as those to be used in the recording materials of the present invention.

Examples of said photo-absorbents include dialkylaminobenzophenones such as Michler's ketone and 4,4'-bis(diethylamino)benzophenone; substituted coumarins such as 7-diethylamino-4-methylcoumarin and 7-diethylamino-3-(2-benzimidazolyl)coumarin; substituted thioxanthones such as 2-chlorothioxanthone and 2,4-diethylthioxanthone; and merocyanine dyes as given below.

(a-1)
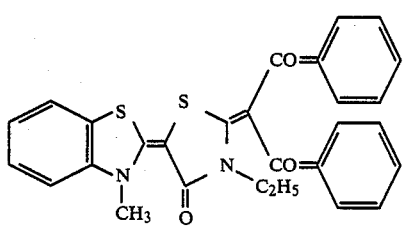

(a-2)
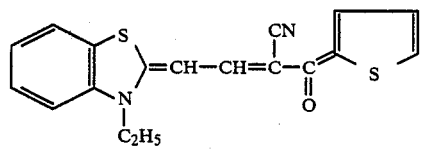

(a-3)
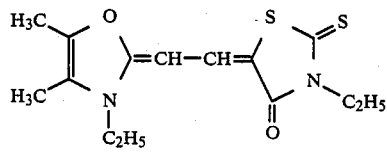

(a-4)
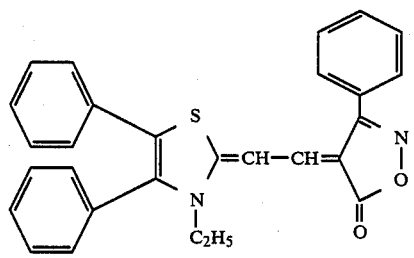

These photo-absorbents may easily be synthesized by means of a known method, for example, the photo-absorbents (a-1) to (a-4) may be synthesized by the methods as described in *Bull. Soc. Chimie Belges*, 57, 364–372 (1948), Japanese patent application (OPI) No. 60104/85, and *J. Amer. Chem. Soc.*, 73, 5326 (1951).

The second component (b) is a hexaaryl-biimidazole. Examples of an aryl group are a phenyl group and substituted phenyl groups, and examples of especially preferred hexaaryl-biimidazoles include 2,2'-bis(o-chlorophenyl)-4,4',5,5'-tetraphenyl-biimidazole, 2,2'-bis(o-methoxyphenyl)-4,4',5,5'-tetraphenyl-biimidazole, 2,2'-bis(o-chlorophenyl)-4,4',5,5'-tetra(m-methoxyphenyl)-biimidazole, 2,2'-bis(o-methylphenyl)-4,4',5,5'-tetraphenyl-biimidazole, etc. These hexaaryl-biimidazoles may easily be synthesized by means of a known method, for example, as disclosed in *Bull Chem. Soc. Japan*, 33, 565 (1960) and *J. Org. Chem.*, 36 [16] 2262 (1971).

The present inventors have tried to obtain still better recording materials having far higher sensitivity and have found that the sensitivity of the recording material may be increased several ten times higher than the case using a polymerization initiator composition comprising only the above mentioned two components (a) and (b) by adding a mercapto compound having a specific structure to these two components (a) and (b), and at last have achieved the present invention.

A mercapto compound is known as a typical radical chain transfer reagent. As shown in the reference example given below, however, in a conventional dissolution image formation method where only a non-exposed part in a light-sensitive layer uniformly coated on a support is dissolved by the use of a developer thereby to obtain a relief image, the effect resulting from the addition of a mercapto compound amounts to merely at most two times or so. On the contrary, in another image formation method using a light-sensitive and pressure-sensitive photographic material, said effect resulting from the addition of a mercapto compound amounts to several ten times, which is in fact a surprising effect.

Mercapto compounds which may be used in the present invention as the component (c) are represented by the above mentioned general formula (I), where Z is an atomic group for formation of a nitrogen-containing heterocyclic nucleus, for example, selected from benzothiazoles, benzoxazoles, benzimidazoles, thiazolines, oxazolines, imidazolines, 1,3,4-thiadiazoles, 1,3,4-triazoles, 1,2,3,4-tetrazoles, pyrimidines, quinazolinones, quinazolines, etc. Especially preferred mercapto compounds are those represented by the following formula (II) or (III):

(II)

where $R_1$ represents an alkyl group, an alkylthio group or a mercapto group.

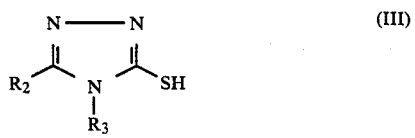
(III)

where $R_2$ represents a hydrogen atom or an alkyl group; and $R_3$ represents an alkyl group or an aryl group.

Examples of mercapto compounds to be used in the present invention are given below.

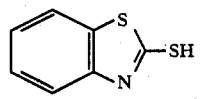 (C-1)

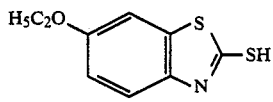 (C-2)

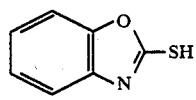 (C-3)

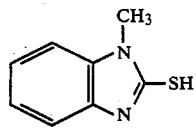 (C-4)

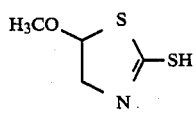 (C-5)

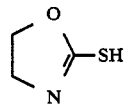 (C-6)

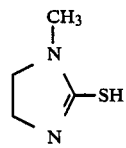 (C-7)

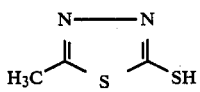 (C-8)

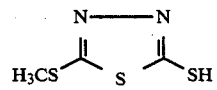 (C-9)

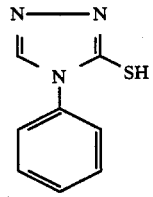 (C-10)

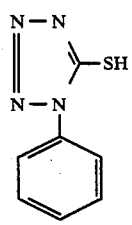 (C-11)

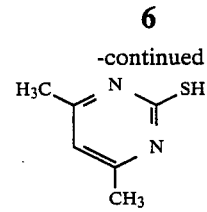 (C-12)

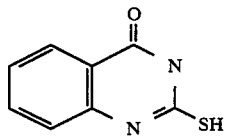 (C-13)

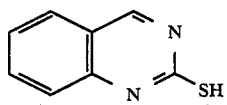 (C-14)

A preferred amount of each of these components (a), (b) and (c) to be used in the present invention is, on the basis of 100 parts by weight of the ethylenic unsaturated bond-containing compound as described above, as follows: The component (a) is 0.1 to 10 parts by weight, especially preferably 1 to 5 parts by weight; the component (b) is 0.5 to 30 parts by weight, especially preferably 2 to 20 parts by weight; and the component (c) is 0.1 to 20 parts by weight, especially preferably 1 to 15 parts by weight.

The component capable of causing a color reaction which is to be used in the present invention is a reagent capable of yielding a color forming component in an acid-base reaction, an oxidation reduction reaction or a chelate formation reaction. For example, a combination of general color former and developer may be used, which is explained in the following description.

A color former is a reagent having a property to color when it has donated an electron or it has accepted a proton such as an acid, and this is not specifically limitative in the present invention. In general, compounds which are almost colorless and have a partial skeleton of a lactone, lactam, sultone, spiropyran, ester or amide may be used, said partial skeleton being ring-opened or cleaved when brought into contact with a developer.

Examples of said color former compounds are crystal violet lactone, 3-diethylamino-6-methyl-7-anilinofluoran, 3-diethylamino-6-chloro-7-anilinofluoran, benzoyl leucomethylene blue, Malachite Green lactone, Rhodamine B lactam, 1,3,3-trimethyl-6'-ethyl-8'-butoxyindolinobenzospiropyran, etc. If necessary, a mixture of said color former may be used.

Examples of developers include salicylic acid derivatives, metal salts of aromatic carboxylic acids, acid clay, bentonite, zinc rhodanide, novolak resins, metal treated novolak resins, etc.

It is important in the present invention that at least one of the combinations of the reagents capable of causing the color reaction must be encapsulated. In other words, either the color former or the developer is to be enclosed in the microcapsules. In general, it is preferred to encapsulate the color former in the microcapsules so as to elevate the color efficiency in color reaction.

When the color former is to be encapsulated in microcapsules, the developer may be added to the color reaction system according to the following means:

(1) The developer is incorporated in a microcapsule-containing layer.

(2) A developer-containing layer is provided on or beneath a microcapsule-containing layer. In this case, an intermediate layer may optionally be provided between said two layers.

(3) A recording material having a developer-containing layer is formed, apart from a recording material having a microcapsule-containing layer, and the two layers in said two recording materials are brought into contact when color developed.

(4) A dispersion solution containing a developer is formed, and this is sprayed on a recording material when color developed.

In color development reaction of the above cases (1) and (2), coloration and termination proceed, for example, according to anyone of the following steps (a) through (d):

(a) Heat (coloration)→exposure (termination)
(b) Pressure (coloration)→exposure (termination)
(c) Exposure→heat (coloration of non-exposed part)
(d) Exposure→pressure (coloration of non-exposed part)

In the above case (3), the microcapsule-containing layer is exposed to light, and the developer-containing layer is superposed thereon and then heated or pressured thereby to color a non-exposed part of the former layer. In this case, another process is possible, where the color former contained in the microcapsules in a non-exposed part is, after exposure, transferred to another sheet under pressure, and then a developer is added to said transferred color former and thus color development is achieved.

In the above case (4), the microcapsule-containing layer is exposed to light, and then the developer-containing dispersion solution is sprayed thereon to achieve the color development. Analogously to the above case (3), the other process is also possible where the color former is first transferred to another sheet and then the developer dispersion is sprayed on the transferred color former to complete the color development.

As mentioned above, various processes are possible for color development reaction in the recording materials of the present invention, and the most preferred process for the present recording material is to pressure the material after exposure thereof to achieve the color development reaction, whereby the exposure sensitivity may be attained most highly efficiently. Thus, the recording materials of the present invention are particularly suitable as light-sensitive and pressure-sensitive recording materials.

Various combinations of reagents capable of participating in the above described color development reaction are disclosed in U.S. Pat. Nos. 2,712,507, 2,730,456, 2,730,457, 3,418,250, 3,432,327, 3,981,821, 3,993,831, 3,996,156, 3,996,405, 4,000,087, etc.; and these combinations may of course be utilized in the present invention.

The components capable of causing the color development reaction are used in the recording material of the present invention in an amount of 0.5 to 20 parts by weight, especially preferably 2 to 7 parts by weight, on the basis of 100 parts by weight of the above described ethylenic unsaturated bond-containing compound. The amount of the developer is about 0.3 to 80 parts by weight to one part by weight of the color former.

In encapsulation of the above described ethylenic unsaturated bond-containing compound, photopolymerization initaitor and color forming component, a solvent may be used, such as a natural or synthetic oil, singly or in the form of a mixture of two or more oils.

Examples of solvents include cotton seed oils, kerosenes, aliphatic ketones, aliphatic esters, paraffins, naphthene oils, alkylated biphenyls, alkylated terphenyls, chlorinated paraffins, alkylated naphthalenes and diarylethanes such as 1-phenyl-1-xylylethane, 1-phenyl-1-p-ethylphenylethane, 1,1'-ditolylethane, etc.

A thermal polymerization inhibitor may be enclosed in the microcapsules, whereby the preservability thereof may be improved better.

Any conventional encapsulation method may be applied to the encapsulation of the above mentioned substances in microcapsules. Various methods for manufacture of capsules have heretofore been known, for example, including (a) a method utilizing coacervation as described in U.S. Pat. Nos. 2,800,457 and 2,800,458; (b) a method by interfacial polymerization as described in British Pat. No. 990,443 and U.S. Pat. No. 3,287,154; (c) a method by precipitation of a polymer as described in U.S. Pat. Nos. 3,418,250 and 3,660,304; and (d) a method of polymerization of reactants from an inner part of oil droplets as described in U.S. Pat. Nos. 3,726,804 and 3,796,669. In particular, the latter two encapsulation methods of (c) polymer precipitation and (d) polymerization of reactants from the inner part of oil droplets are especially preferred, as capsules having a uniform particle size may be obained in a short period of time, which are preferred to be light-sensitive materials. The particle size of capsules is preferably $20\mu$ or less, especially $10\mu$ or less, in view of the handling of light-sensitive materials during preservation thereof.

As a support may be used a plastic film, a synthetic paper, an alumnium plate, paper, etc. Examples of the paper include a paper having single gloss surface dried by Yankee Drier, an art paper, etc.

Upon coating the light-sensitive material on a support may be used a binder such as a PVA or latex and a protective agent such as a starch. Various kinds of additives, binders, antioxidants, smudge preventives and surfactants which have heretofore been used in conventional recording materials as well as the methods how to coat or how to use said substances are well known by those skilled in the art, which are disclosed in U.S. Pat. Nos. 2,711,375 and 3,625,736, British Pat. No. 1,232,347, Japanese patent application (OPI) Nos. 44012/75, 50112/75 (corresponding to U.S. Pat. No. 3,468,200), 127718/75 (corresponding to U.S. Pat. No. 4,020,261) and 30615/75, and U.S. Pat. Nos. 3,836,383 and 3,846,331; and these conventional techniques may be utilized in the present invention.

In the case when the other one color forming component which is not enclosed in microcapsules is to be added to a different layer but not added to a microcapsule-containing layer (including the case where said component is to be added to a layer of a different recording material), said component is dispersed in a binder such as a PVA or latex, and then coated on said layer. In this case, the above described protective agent, antioxidant, smudge preventive, surfactant, etc., may also be used, in addition to said color forming component.

The present invention will be explained in greater detail by reference to the following Examples, which, however, are not intended to be interpreted as limiting the scope of the present invention.

EXAMPLE 0.7 g of the component (c) as shown in the following Table 1 was added to a monomer mixture comprising 28 g of trimethylolpropane triacrylate and 7 g of methyl methacrylate, and dissolved by the use of an ultrasonic dispersion machine. On the other hand, 6 g of methylene chloride, 0.7 g of the component (a) and 2.1 g of the component (b) each as shown in Table 1 and 2.1 g of 3-diethylamino-6-chloro-7-anilinofluoran, which is a color former, were dissolved, and the resulting solution was added to the previously prepared solution to obtain an oily solution. Apart from these, various kinds of comparative samples were formed analogously. One comparative sample did not contain the component (c); the other contained N-phenylglycine instead of the component (c); and another contained 3.5 g of benzoin-butylether instead of the components (a), (b) and (c). These comparative samples were analogously prepared, dissolving said components in the monomer mixture.

On the other hand, a mixture comprising 17.5 g of 10% gum arabic aqueous solution, 18.8 g of 12% isobutylene/maleic anhydride aqueous solution and 26.8 g of distilled water was regulated to have a pH value of 3.5 with sulfuric acid, and 4.6 g of urea and 0.6 g of resorcin were added thereto, and then the previously prepared oily solution was added to the resulting solution and emulsified to obtain a dispersion having a particle size of 3μ. Next, 12.9 g of 36% formalin was added thereto and heated up to 60° C. while stirring. After 1 hour, 9.0 g of 5% ammonium sulfate aqueous solution was added thereto and the whole was further stirred for 1 hour while keeping at 60° C., and thereafter cooled. Afterwards, NaOH was added to the solution to adjust the pH value thereof to 7.0.

To 5 g of each of the thus obtained capsule solutions were added 1.53 g of 15% polyvinyl alcohol aqueous solution, 3.47 g of distilled water and 0.57 g of starch to obtain a coating solution. This was coated on an art paper with Coating Rod 10 and dried for 2 minutes at 100° C. to obtain Light-Sensitive Sheets Nos. 1 to 7.

On the other hand, 0.6 g of 48% SBR latex, 4 g of 10% etherified starch aqueous solution, 2.1 g of zinc carbonate, 1.3 g of 50% sodium silicate aqueous solution, 0.1 g of sodium hexametaphosphate and 13 g of Silton F-242 clay were added to 21.8 g of water and stirred for 15 minutes with a homogenizer.

The resulting solution was coated on an art paper with Coating Rod 18 and dried at 100° C. for 2 minutes to obtain a developing sheet.

Reproduction of an image was carried out as follows: The above obtained photographic sheet was exposed to light through a manuscript of a linear image, said light being obtained from an ultrahigh pressure mercury lamp through an interference filter and having a wavelength of about 365 nm or so. After the exposure, the thus exposed light-sensitive sheet and the above obtained developing sheet were attached, the coated surfaces of the two sheets facing to each other, and the thus laminated sheet was introduced into pressure rollers with a linear pressure of 100 kg/cm. The capsules in the non-exposed part were crushed and transferred to the developing sheet. The transferred part gave a sharp black image having a density of 1.0. The part corresponding to the exposed part has a density which varies depending upon the exposure amount, and the minimum exposure amount capable of giving a density of 0.1 or less to the exposed part is defined as the "sensitivity" of the sheet (which corresponds to the toe sensitivity). This means that the smaller the exposure energy to be imparted to the light-sensitive sheet is, the higher the sensitivity the sheet has. The results are given in the following Table 1.

TABLE 1

| Light-Sensitive Sheet No. | Photopolymerization Initiator Composition | | | Exposure Energy (erg/cm$^2$) |
|---|---|---|---|---|
| | Component (a) | Component (b) | Component (c)* | |
| 1 (Comparative Example) | 4,4'-Bis(diethylamino)-benzophenone | 2,2'-Bis(o-chlorophenyl)-4,4',5,5'-tetraphenyl-biimidazole | — | 10,000 |
| 2 (Present Invention) | 4,4'-Bis(diethylamino)-benzophenone | 2,2'-Bis(o-chlorophenyl)-4,4',5,5'-tetraphenyl-biimidazole | (C-3) | 500 |
| 3 (Present Invention) | 4,4'-Bis(diethylamino)-benzophenone | 2,2'-Bis(o-chlorophenyl)-4,4',5,5'-tetra(m-methoxyphenyl)-biimidazole | (C-3) | 500 |
| 4 (Present Invention) | 4,4'-Bis(diethylamino)-benzophenone | 2,2'-Bis(o-chlorophenyl)-4,4',5,5'-tetraphenyl-biimidazole | (C-9) | 150 |
| 5 (Present Invention) | 7-Diethylamino-4-methylcoumarin | 2,2'-Bis(o-chlorophenyl)-4,4',5,5'-tetraphenyl-biimidazole | (C-1) | 500 |
| 6 (Present Invention) | 2,4-Diethylthioxanthobe | 2,2'-Bis(o-chlorophenyl)-4,4',5,5'-tetraphenyl-biimidazole | (C-3) | 700 |
| 7 (Comparative Example) | 4,4'-Bis(diethylamino)-benzophenone | 2,2'-Bis(o-chlorophenyl)-4,4',5,5'-tetraphenyl-biimidazole | N—Phenyl-glycine | 10,000 |
| 8 (Comparative Example) | Benzoin-butylether | 2,2'-Bis(o-chlorophenyl)-4,4',5,5'-tetraphenyl-biimidazole | | 80,000 |

*The component (c) corresponds to the number of the above listed compounds.

As apparent from the above results given in Table 1, the photopolymerization initiator compositions comprising the components (a) and (b) may attain a higher sensitivity than the other conventional photopolymerization initiator of benzoin-butylether, and moreover, the photopolymerization initiator compositions of the present invention comprising components (a), (b) and (c) may attain a far higher sensitivity than any other cases, which is a surprising effect.

In this connection, it is noted that Sample No. 7 where N-phenylglycine, which was heretofore been known as a reagent of high sensitivity, was used instead of the component (c) could not attain such a higher sensitivity.

REFERENCE EXAMPLE

A photopolymerization composition comprising the following compositions was coated on a PET base having a thickness of 100μ, and dried for 2 minutes at 100° C. A polyvinyl alcohol aqueous solution was coated on the surface of said coated base and dried for 2 minutes at 100° C. to form an overcoat layer. Thus, a light-sensitive sheet was formed.

Three kinds of photopolymerization initiator compositions as shown in the following Table 2 were used; one comprising all the components (a), (b) and (c) of the present invention; the other one not using the component (c); and another one using N-phenylglycine instead of the component (c).

| Components of Photopolymerization Composition (solution): | |
|---|---|
| Trimethylolpropane Triacrylate | 28 g |
| Methyl Methacrylate | 7 g |
| Photopolymerization Initiator Composition | as shown in Table 2 |
| Benzyl Methacrylate/Methacrylic Acid Copolymer (molar ratio: 73/27) | 52.5 |
| Methyl Ethyl Ketone | 350 ml |
| Methyl Cellosolve Acetate | 260 ml |

Exposure was carried out in the same manner as in Example 1. After the exposure, each of the sheets was developed with a developer comprising the following components:

| Developer: | |
|---|---|
| Sodium Carbonate Anhydride | 10 g |
| Butyl Cellosolve | 5 g |
| Water | 1 liter |

After the development, the non-exposed part in the light-sensitive sheet was dissolved out to obtain a relief image thereon, and the sensitivity of said sheet was determined on the basis of the lowermost exposure amount capable of forming the relief image. In the result, the smaller the exposure energy is, the higher the sensitivity the sheet has. The results are given in the following Table 2.

TABLE 2

| | Photopolymerization Initiator Composition | | | Exposure |
|---|---|---|---|---|
| Run No. | Component (a) (used amount: 0.7 g) | Component (b) (used amount: 2.1 g) | Component (c) (used amount: 0.7 g) | Energy (erg/cm$^2$) |
| 1 | 4,4'-Bis(diethylamino)-benzophenone | 2,2'-Bis(o-chlorophenyl)-4,4',5,5'-tetraphenyl-biimidazole | — | 10,000 |
| 2 | 4,4'-Bis(diethylamino)-benzophenone | 2,2'-Bis(o-chlorophenyl)-4,4',5,5'-tetraphenyl-biimidazole | (C-9) | 5,000 |
| 3 | 4,4'-Bis(diethylamino)-benzophenone | 2,2'-Bis(o-chlorophenyl)-4,4',5,5'-tetraphenyl-biimidazole | N—Phenylglycine | 4,000 |

As apparent from the results given in the above Table 2, it is noted that in the photopolymerization composition to form a relief image, the photopolymerization initiator composition comprising components (a), (b) and (c) may attain a higher sensitivity than that comprising components (a) and (b) only. Contrary to the case of the present invention, however, the initiator composition comprising the components (a) and (b) and N-phenylglycine is noted to be more highly sensitive than any of the other two compositions.

In conclusion, the effect of the present invention is apparent from the above explanation, especially from the results in the above Example and Reference Example.

The combination of components (a) and (b) may attain a higher sensitivity than the conventional benzoin-butylether. Moreover, the combination of components (a), (b) and (c) of the present invention may attain surprisingly far higher sensitivity than any other cases. In particular, the improvement on the sensitivity of the microcapsule type recording materials of the present invention obtainable by the combination of components (a), (b) and (c) is especially more remarkable than that on the sensitivity of another relief image type photographic material obtained by the combination of components (a) and (b) and N-phenylglycine. Thus, the combination of components (a), (b) and (c) of the present invention can be effectively used in microcapsule-containing recording materials.

While the invention has been described in detail and with reference to specific embodiments thereof, it will be apparent to one skilled in the art that various changes and modifications can be made therein without departing from the spirit and scope thereof.

What is claimed is:

1. A light-sensitive and pressure-sensitive recording material comprising (i) an addition polymerizable compound having at least one ethylenic unsaturated double bond, (ii) a photopolymerization initiator composition and (iii) at least one component capable of causing a color reaction, wherein components (i), (ii) and (iii) are contained in microcapsules which cause color development upon rupturing the microcapsules in non-exposed areas, rupturing being effected by the application of pressure to the microcapsules and being after imagewise exposure of the microcapsules to light; and wherein said photopolymerization initiator composition (ii) comprises the following components (a), (b) and (c):
   (a) a photo-absorbent having a molecular extinction coefficient of $10^3$ or more at a maximum absorption wavelength;
   (b) a hexaarly-biimidazole; and
   (c) a heterocyclic mercapto compound selected from compounds represented by the following formula (II) and (III):

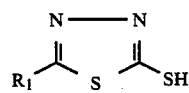
(II)

wherein $R_1$ is an alkyl group, an alkylthio group or a mercapto group;

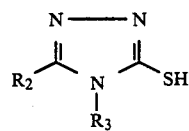
(III)

wherein $R_2$ is a hydrogen atom or an alkyl group; $R_3$ is an alkyl group or an aryl group, wherein the content of component (a) is 0.1 to 10 parts by weight, that of component (b) is 0.5 to 30 parts by weight, and that of component (c) is 0.1 to 20 parts by weight, each on the basis of 100 parts by weight of said ethylenic unsaturated bond-containing compound (i), and wherein component (iii) is employed in an amount of from 0.5 to 20 parts by weight on the basis of 100 parts by weight so component (i) wherein the microcapsules have a capsule wall which is formed from urea, resorcinol and formaldehyde.

2. The recording material as claimed in claim 1, wherein said photo-absorbent (a) has a maximum absorption within a wavelength range of about 300 to 600 nm and has a molecular extinction coefficient of $10^3$ or more at said maximum absorption wavelength.

3. The recording material as claimed in claim 2, wherein said photo-absorbent (a) is selected from dialkylaminobenzophenones, substituted coumarins, substituted thioxanthones and merocyanine dyes.

4. The recording material as claimed in claim 1, wherein said hexaaryl-biimidazole (b) contains phenyl and/or substituted phenyl groups as the aryl groups.

5. The recording material as claimed in claim 4, wherein said hexaaryl-biimidazole (b) is selected from 2,2'-bis(o-chlorophenyl)-4,4',5,5'-tetraphenylbiimidazole, 2,2'-bis(o-methoxyphenyl)-4,4',5,5'-tetraphenylbiimidazole, 2,2'-bis(o-chlorophenyl)-4,4',5,5'-tetra(m-methoxyphenyl)biimidazole and 2,2'-bis(o-methylphenyl)-4,4',5,5'-tetraphenylbiimidazole.

6. The recording material as claimed in claim 1, wherein the content of component (a) is 1 to 5 parts by weight, that of component (b) is 2 to 20 parts by weight and that of component (c) is 1 to 15 parts by weight, each on the basis of 100 parts by weight of said ethylenic unsaturated bond-containing compound (i).

7. The recording material as claimed in claim 1, wherein component (iii) is employed in an amount of from 2 to 7 parts by weight on the basis of 100 parts by weight of component (i).

8. The recording material as claimed in claim 1, wherein said heterocylic mercapto compound is selected from the group consisting of

(C-8)

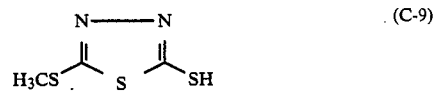

(C-9)

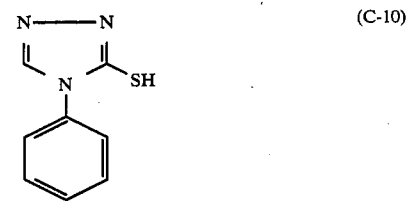

(C-10)

and

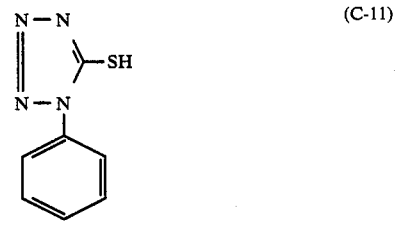

(C-11)

* * * * *